United States Patent
Fu et al.

(10) Patent No.: US 7,704,887 B2
(45) Date of Patent: Apr. 27, 2010

(54) REMOTE PLASMA PRE-CLEAN WITH LOW HYDROGEN PRESSURE

(75) Inventors: Xinyu Fu, Fremont, CA (US); John Forster, San Francisco, CA (US); Jick Yu, San Jose, CA (US); Ajay Bhatnagar, Santa Clara, CA (US); Praburam Gopalraja, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 882 days.

(21) Appl. No.: 11/334,803

(22) Filed: Jan. 17, 2006

(65) Prior Publication Data

US 2007/0117397 A1    May 24, 2007

Related U.S. Application Data

(63) Continuation-in-part of application No. 11/284,775, filed on Nov. 22, 2005.

(51) Int. Cl.
*B08B 3/00* (2006.01)
*H01L 21/302* (2006.01)

(52) U.S. Cl. .................. 438/710; 134/61
(58) Field of Classification Search .......... None
See application file for complete search history.

(56) References Cited

U.S. PATENT DOCUMENTS

| | | | | |
|---|---|---|---|---|
| 4,883,686 A | * | 11/1989 | Doehler et al. | 427/562 |
| 4,961,958 A | * | 10/1990 | Desphandey et al. | 427/577 |
| 5,432,315 A | * | 7/1995 | Kaji et al. | 219/121.43 |
| 5,449,433 A | * | 9/1995 | Donohoe | 438/731 |
| 5,780,359 A | * | 7/1998 | Brown et al. | 438/659 |
| 5,958,510 A | | 9/1999 | Sivaramakrishnam et al. | |
| 6,083,363 A | * | 7/2000 | Ashtiani et al. | 204/298.01 |
| 6,090,629 A | | 7/2000 | Woychik | 134/31 |
| 6,107,192 A | * | 8/2000 | Subrahmanyan et al. | 438/637 |
| 6,140,247 A | | 10/2000 | Muraoka et al. | |
| 6,245,662 B1 | | 6/2001 | Naik et al. | 438/622 |
| 6,341,574 B1 | * | 1/2002 | Bailey et al. | 118/723 I |
| 6,379,575 B1 | | 4/2002 | Yin et al. | |

(Continued)

OTHER PUBLICATIONS

H. Morgner et al., "Experimental and theoretical study of the penning ionisation of H atoms by He metastables", *J. Phys. B: Atom. Molec. Phys.*, vol. 12, No. 11, 1805-1820 pp., 1979.

(Continued)

*Primary Examiner*—Allan Olsen
(74) *Attorney, Agent, or Firm*—Law Office of Charles Guenzer

(57) ABSTRACT

A plasma cleaning method particularly useful for removing photoresist and oxide residue from a porous low-k dielectric with a high carbon content prior to sputter deposition. A remote plasma source produces a plasma primarily of hydrogen radicals. The hydrogen pressure may be kept relatively low, for example, at 30 milliTorr. Optionally, helium may be added to the processing gas with the hydrogen partial pressure held below 150 milliTorr. Superior results are obtained with 70% helium in 400 milliTorr of hydrogen and helium. Preferably, an ion filter, such as a magnetic filter, removes hydrogen and other ions from the output of the remote plasma source and a supply tube from the remote plasma source includes a removable dielectric liner in combination with dielectric showerhead and manifold liner.

15 Claims, 4 Drawing Sheets

U.S. PATENT DOCUMENTS

| | | | |
|---|---|---|---|
| 6,392,187 B1 * | 5/2002 | Johnson | 219/121.43 |
| 6,440,864 B1 * | 8/2002 | Kropewnicki et al. | 438/710 |
| 6,568,346 B2 * | 5/2003 | Pu et al. | 118/723 I |
| 6,634,313 B2 * | 10/2003 | Hanawa et al. | 118/723 IR |
| 6,712,020 B2 * | 3/2004 | Cox et al. | 118/723 I |
| 6,755,150 B2 * | 6/2004 | Lai et al. | 118/723 I |
| 6,805,139 B1 * | 10/2004 | Savas et al. | 134/1.3 |
| 6,890,850 B2 | 5/2005 | Lee et al. | 438/631 |
| 6,902,629 B2 | 6/2005 | Zheng et al. | 134/31 |
| 6,921,727 B2 | 7/2005 | Chiang et al. | 438/778 |
| 6,927,178 B2 | 8/2005 | Kim et al. | 438/778 |
| 6,949,203 B2 | 9/2005 | Hsieh et al. | 216/67 |
| 7,094,613 B2 * | 8/2006 | Mui et al. | 438/9 |
| 7,166,816 B1 * | 1/2007 | Chen et al. | 219/121.41 |
| 7,169,708 B2 * | 1/2007 | Inukai | 438/700 |
| 7,363,876 B2 * | 4/2008 | Lai et al. | 118/723 I |
| 2003/0194495 A1 | 10/2003 | Li et al. | 427/255.28 |
| 2003/0224591 A1 * | 12/2003 | Latchford et al. | 438/619 |
| 2004/0110360 A1 * | 6/2004 | Basceri et al. | 438/459 |
| 2004/0168705 A1 * | 9/2004 | Sun et al. | 134/1.2 |
| 2004/0219789 A1 | 11/2004 | Wood et al. | 438/690 |
| 2004/0224504 A1 * | 11/2004 | Gadgil | 438/680 |
| 2005/0009325 A1 * | 1/2005 | Chung et al. | 438/637 |
| 2005/0130404 A1 | 6/2005 | Moghadam et al. | |
| 2005/0205206 A1 * | 9/2005 | Lembersky | 156/345.5 |
| 2005/0272247 A1 * | 12/2005 | Ikeda et al. | 438/618 |
| 2006/0068104 A1 * | 3/2006 | Ishizaka et al. | 427/248.1 |
| 2006/0094219 A1 * | 5/2006 | Soda | 438/597 |
| 2006/0102895 A1 * | 5/2006 | Hendrix et al. | 257/40 |
| 2006/0205188 A1 * | 9/2006 | Igeta et al. | 438/478 |
| 2006/0260750 A1 * | 11/2006 | Rueger | 156/345.38 |
| 2007/0054496 A1 * | 3/2007 | Paduraru et al. | 438/725 |

OTHER PUBLICATIONS

Allowed Claims: Appl. No. 11/284,775.

* cited by examiner

REMOTE PLASMA PRE-CLEAN WITH LOW HYDROGEN PRESSURE

RELATED APPLICATION

This application is a continuation in part of Ser. No. 11/284,775, filed Nov. 22, 2005 and incorporated herein by reference.

FIELD OF THE INVENTION

The invention relates generally to plasma cleaning in the process of fabricating integrated circuits. In particular, the invention relates to plasma cleaning performed between patterned etching of a dielectric layer and deposition.

BACKGROUND ART

Advanced integrated circuits, such as those contemplated for the 45 nm node, will require the use of extra low-k dielectric (electrically insulating) materials for the interlevel dielectric layer interconnecting two levels of wiring. Low-k materials having a constant of somewhat less than 3.9 (the value for silicon dioxide) have already entered commercial production. However, even lower dielectric constants, for example, below 2.5, will be required in the future. An example of this material is Black Diamond™ II (BDII) dielectric commercially available from Applied Materials of Santa Clara, Calif. This dielectric material, which Li describes in U.S. patent application Ser. No. 2003/0194495, may be characterized as carbon-doped silicon oxide (or silicon oxycarbide) having a carbon fraction of above 10 at %. Improvements include BDIIx dielectric, which is UV cured and may have a porosity of 30%, and DBIIebeam dielectric, which is cured with electrons. Other carbon-containing low-k dielectrics are known, including Silk® and Cyclotene® (benzocyclobutene) dielectric materials available from Dow Chemical. Many of these materials are characterized as organic or polymeric dielectrics.

A prototypical structure in the formation of an inter-level interconnect is illustrated in the cross-sectional view of FIG. 1. A lower dielectric layer 10 includes a conductive feature 12 formed at its surface. The conductive feature 12 for advanced inter-level connections is typically composed of copper but similar geometries apply to contacting active semiconductor regions of a silicon substrate. An upper dielectric layer 14 of ultra low-k dielectric material is deposited over the lower dielectric layer 10 and the conductive feature. A hole 16 is photolithographicafly defined and etched through the upper dielectric layer 14 to the conductive feature 14. For the typical dual damascene interconnect used in copper metallization, the hole 16 is composed of a narrow lower via forming the vertical interconnect to the conductive feature 12 and a wide upper trench forming the horizontal interconnect between different portions of the integrated circuit. For dual damascene structures, the conductive feature 12 may be part of the copper-filled trench formed in the lower level dielectric 10. After the hole has been etched, a thin substantially conformal barrier layer, for example, of Ta/TaN is coated, typically by magnetron sputtering onto the sides of the hole 16 as well as over the field area of the upper dielectric layer 14. A thin substantially conformal copper seed layer is then deposited over the barrier layer, typically also by magnetron sputtering. Thereafter, copper is electroplated into the hole 16 and over the field area. Finally, chemical mechanical polishing (CMP) is used to remove the copper outside the hole 16.

The photolithographic etching step, even after photoresist ashing, often leaves a carbonaceous or fluorocarbon polymeric layer 18 on the sides of the hole 16 which is advantageously used to achieve highly anisotropic etching but remains after cessation of etching. It also may leave an etching residue 20 at the bottom of the trench, which may be a combination of carbon, silicon and fluorine by products of the etching chemistry. Further, the exposed copper in the conductive feature 12 is likely to have oxidized to copper oxide. Yet further, ashing residue 22 tends to form at the lip of the hole 16. Etching residues 20 and copper oxide at the bottom of the hole 16, if not removed prior to barrier deposition before the metallization deposition, increase the contact resistance. The polymeric coating 18 and the ashing residues 22 interfere with the bonding of the barrier layer to the dielectric layer 14 so that the barrier layer and copper via structure may delaminate during fabrication or during operation, resulting in a substantial reliability problem. It is thus greatly desired to remove the residues 18, 20, 22 and the copper oxide before the barrier deposition begins.

With conventional silica dielectrics, it has been common to dry clean the wafer between the etching and deposition steps by sputter etching the patterned wafer to remove the residue. Such sputter etching typically involves highly energetic ions, which do not greatly affect silica dielectric layers, which are relatively hard. However, low-k dielectric layers tend to be relatively soft. Therefore, a sputter etch tends to deleteriously etch and degrade the low-k dielectric layer. A softer chemical etching may be performed using a oxygen plasma generated in the cleaning chamber adjacent the wafer, that is, an in situ plasma. This cleaning process proved satisfactory for the early forms of low-k dielectric having a dielectric constant k of about 3.7 and not being porous. However, the in situ oxygen plasma has proved unsatisfactory for the most recent ultra low-k films having a k value of about 2.5 and a porosity of greater than 10%. It is believed that the oxygen plasma includes a high fraction of oxygen atoms which are attracted to the negative self-bias that develops on a floating body exposed to the plasma. The oxygen ions then strike the ultra low-k film with sufficient energy to damage it. Accordingly, the practice has developed of cleaning the patterned wafer with an oxygen plasma generated from a remote plasma source (RPS), as disclosed by Wood et al. in U.S. Patent Application Publication 2004/0219789. The remotely generated plasma emphasizes electrically neutral radicals while the in situ plasma emphasizes electrically charged ions. The remotely generated oxygen plasma projects many neutral and low-energy oxygen radicals to the wafer, which oxidize and otherwise chemically react with the different residues to remove them.

However, excited oxygen has not proved satisfactory for the ultra low-k dielectric materials. The reduction in dielectric constant is often obtained by a high porosity in the dielectric material. Dielectric layers of BDII may have a porosity of over 10%, even above 30%. Therefore, they are not only very soft, they are also very reactive to an oxidizing dry cleaning. Furthermore, oxygen incorporated into the dielectric tends to produce a more polarizable bond than the silicon and carbon bonds, that is, to increase the dielectric constant. As a result, dry cleaning based on reducing chemistry has been developed using, for example, remotely generated plasmas of $NH_3$ (see U.S. Pat. No. 6,440,864 to Kropewnicki et al.) or relatively high pressures of $H_2$. The hydrogen approach has prevailed, but the results have still not been totally satisfactory. Even very small amounts of water vapor in the hydrogen plasma significantly reduce the hydrophobic property of the porous low-k film and thereby tends to increase the dielectric constant. Even pure hydrogen tends to increase the dielectric constant somewhat. Further, reasonable etching rates have been achieved by increasing the chamber pressure, but the capacity of power supplies need to follow the increased pressure. Also, at the higher hydrogen pressures, the fraction of the hydrogen from the remote plasma source that is ionized and leaks into the cleaning chamber is increased. Hydrogen ions tend to be energetically attracted to the wafer and we believed they damage the porous low-k material.

SUMMARY OF THE INVENTION

One aspect of the invention includes plasma dry cleaning of a substrate, particularly a low-k dielectric containing significant carbon and having a high porosity, with a plasma of hydrogen radicals produced by a remote plasma source. No oxygen or water vapor needs be included. The hydrogen pressure is preferably kept moderately low, for example, between 10 and 150 milliTorr with 30 milliTorr being a particularly preferred pressure.

Alternatively, the plasma may contain a combination of hydrogen and a noble gas, preferably helium, with a hydrogen partial pressure of less than 200 milliTorr and greater than 40 milliTorr with a total pressure of between 200 and 600 mIlliTorr.

The supply tube between the remote plasma source advantageously includes a dielectric liner, for example, of a ceramic such as alumina. Advantageously also, an ion filter is disposed between the remote plasma source and the processing chamber to remove hydrogen and other ions from the plasma. The ion filter may be a magnetic filter producing a magnetic field transverse to the axis of the supply tube.

DETAILED DESCRIPTION OF THE PREFERRED EMBODIMENT

It has been observed that a very low pressure or even partial pressure of hydrogen from a remote plasma source with a substantial absence of oxygen and water provides acceptable and even superior etch rate and significantly reduces the increase of dielectric constant during dry cleaning.

Figure 1:
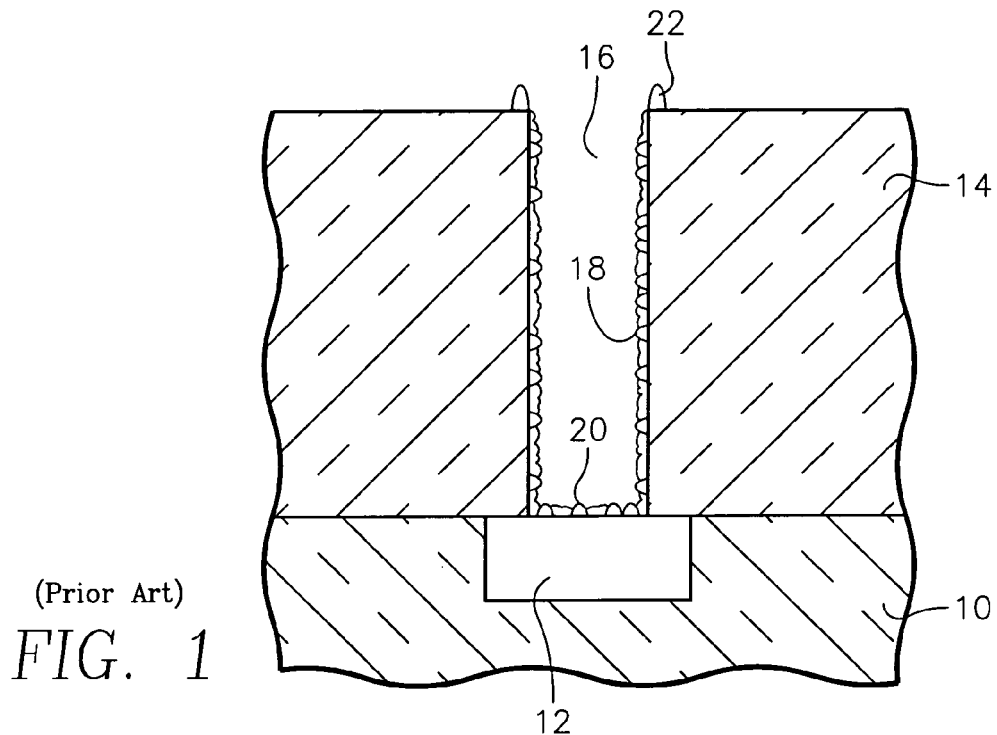
FIG. 1 is a cross-sectional view of an inter-level interconnect structure or via.

A remote plasma cleaning chamber 30 illustrated in the cross-sectional view of FIG. 1 includes a vacuum chamber 32 pumped by a vacuum pump system 34. A pedestal 36 within the vacuum chamber 32 supports a wafer 38 to be cleaned in opposition to a gas showerhead 40 supplying a process gas through a large number of apertures 42. The pedestal 36 includes a heater to raise the temperature of the wafer 38 to a desired etching temperature. The process gas according to one aspect of the invention is either pure hydrogen gas ($H_2$), which is supplied from a hydrogen gas source 44 through a mass flow controller 46, or a combination of hydrogen and helium (He), which is supplied from a helium gas source 48 through another mass flow controller 50. A remote plasma source 52 receives the gas and excites it into a plasma. The remote plasma source 52 may be a pair of electrodes positioned on opposed sides of a delivery tube for the process gas and driven by an RF power source or an RF inductive coil around the delivery tube or other type of antenna although other types of plasma generators are possible. The excited gas is delivered though a supply tube 54 to a gas manifold 56 in back of the showerhead 42. A manifold liner 58 may cover the walls of the manifold 56. The excited gas is thus delivered uniformly through the showerhead 40 to the wafer 38 being cleaned.

Figure 3:
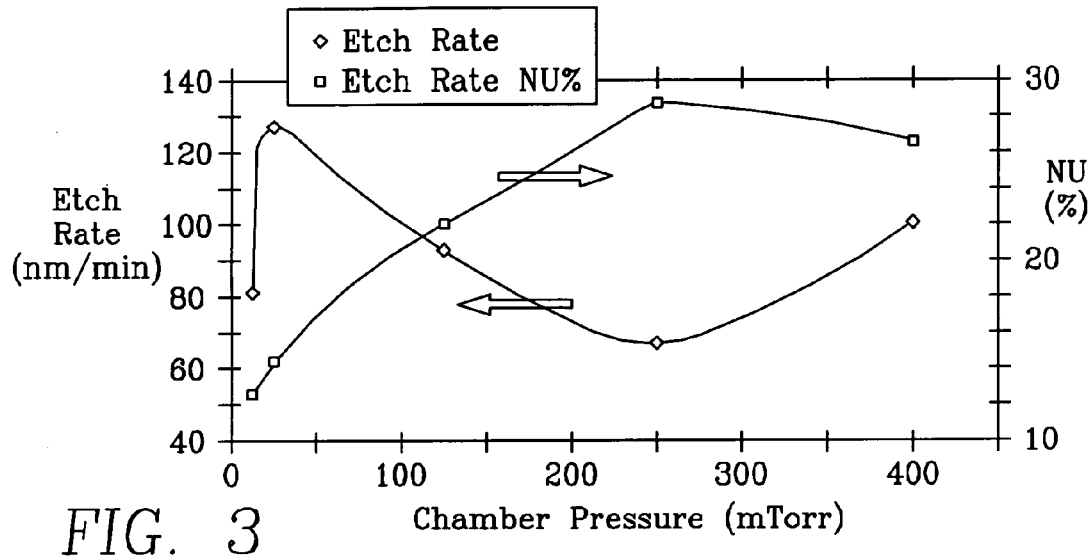
FIG. 3 is a graph illustrating the etch rate and its uniformity in pre-cleaning of a low-k dielectric as a function of hydrogen pressure from a remote plasma source.

The etch rate of photoresist and etch non-uniformity have been measured for photoresist formed over a BDII dielectric on a substrate and exposed at about 300° C. to an excited gas of pure hydrogen at various chamber pressures excited in a remote plasma source and magnetically filtered to form a neutral excited gas. The results are plotted in FIG. 3. The results between 250 and 400 milliTorr demonstrate why 400 milliTorr was previously recommended as the best practice since the photoresist etch rate improves nearly proportionally to hydrogen pressure within that range, as is expected, and the non-uniformity is fairly constant. Even higher pressures could possibly provide better results, but require excessively large power supplies. Further, higher pressures are likely to increase the hydrogen ion leakage and other charged particles into the process area. Surprisingly, though, the tests show a double-peak structure in the dependence of etch rate upon hydrogen pressure. Below 250 milliTorr, the etch rate begins to increase with decreasing pressure and reaches a peak around 40 milliTorr in the very low-pressure (VLP) range before it falls again. Furthermore, the non-uniformity continually decreases below about 250 milliTorr. Depending upon the details of the process and chamber conditions, an advantageous hydrogen pressure is believed to lie in a range of 10 to 150 millliTorr, preferably 20 to 120 milliTorr. However, the invention is not limited to these ranges.

It is believed that the lower peak arises from the competition between radical H* generation and H* recombination into neutral $H_2$. Below the lower peak, corresponding to a mean free path for the recombination, recombination is negligible and H* generation increases with increasing pressure. At increasing pressures just above the lower peak, the increase in H* recombination to $H_2$ outstrips any increase in H* generation.

The low dielectric constant of advanced dielectric films, such as Black Diamond, is produced at least in part by an increasing carbon fraction. The deleterious increase in dielectric constant produced in the plasma cleaning of the prior art is believed to be caused by a depletion of the carbon, particularly at the dielectric's surface.

Figure 4:
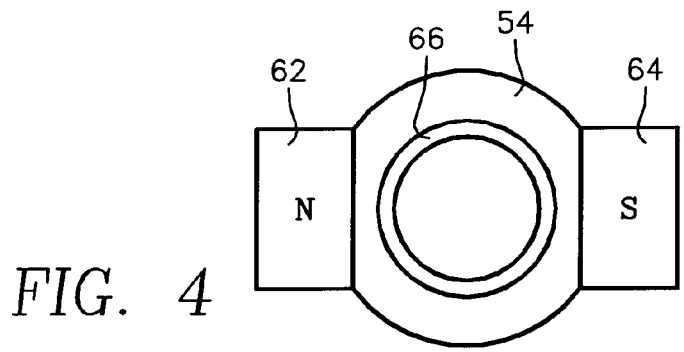
FIG. 4 is axial cross-section of a magnetic filter used in the RPC chamber of FIG. 2.
Figure 5:
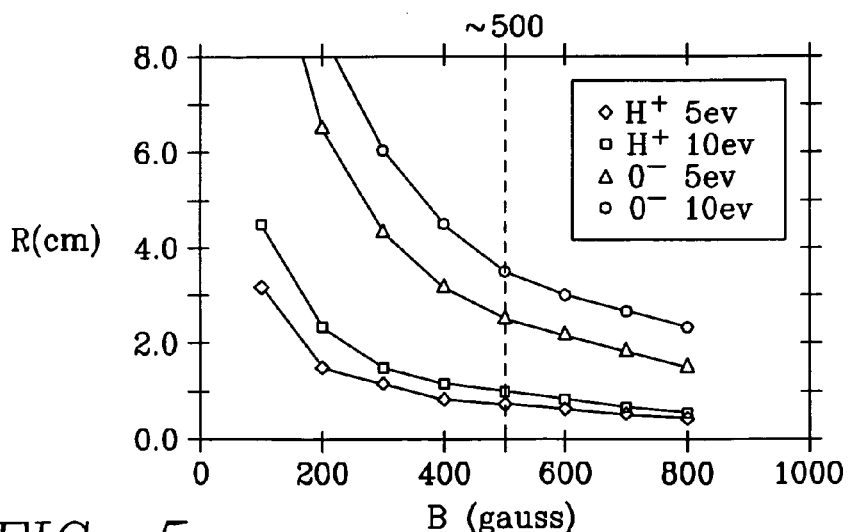
FIG. 5 is a graph of the ion deflection obtained in the magnetic filter.

In the past, hydrogen ions $H^+$ were satisfactory plasma cleaning agents for rugged silica dielectrics. However, even the self-bias that develops on a floating pedestal 16 is sufficient to accelerate the hydrogen ions to sufficient energy to damage the low-k dielectric. In one aspect of the invention, a magnetic ion filter, additionally illustrated in the cross-sectional axial view of FIG. 4, is placed between the remote plasma source 52 and the showerhead 40. The ion filter may include two horizontally opposed permanent magnets 62, 64 placed on opposed sides of the supply tube 54 to create a horizontal magnetic field B extending between them perpendicular to the axis of the supply tube 54. Preferably, the magnets 62, 64 (or the plural magnets constituting an effective combined magnet) have sufficient lateral widths that their magnetic field is substantially constant across the dimension of the supply tube 54 perpendicular to field direction. The magnetic field creates a Lorentz force on the hydrogen ions flowing through the supply tube 54 along its axis to thereby deflect them to the walls of the supply tube 54 where they are absorbed or at least neutralized. Under some conditions, the ions are trapped on the magnetic field lines and either neutralize there or drift to the walls. The graph of FIG. 5 illustrates the diverting force, measured as the cyclotron radius, for hydrogen and oxygen ions of 5 and 10 eV kinetic energy as a function of applied magnetic field B. A 3×2 magnet array is estimated to create a magnetic field of 500 gauss magnetic field at the edge of the supply tube 54 and of 650 gauss at its center. This magnetic filter has been found to be effective in removing about 99% of the charged particles leaking from the remote plasma source 52. On the other hand, neutral hydrogen radicals H* are unaffected by the magnetic field and continue to drift with the gas to the manifold 56 and then out of the apertures 42 of the showerhead 40. The hydrogen radicals form an excited but neutral gas and do not technically constitute a plasma containing ions and electrons. Other ion filters may be used, for example, an electrostatic deflector.

Figure 2:
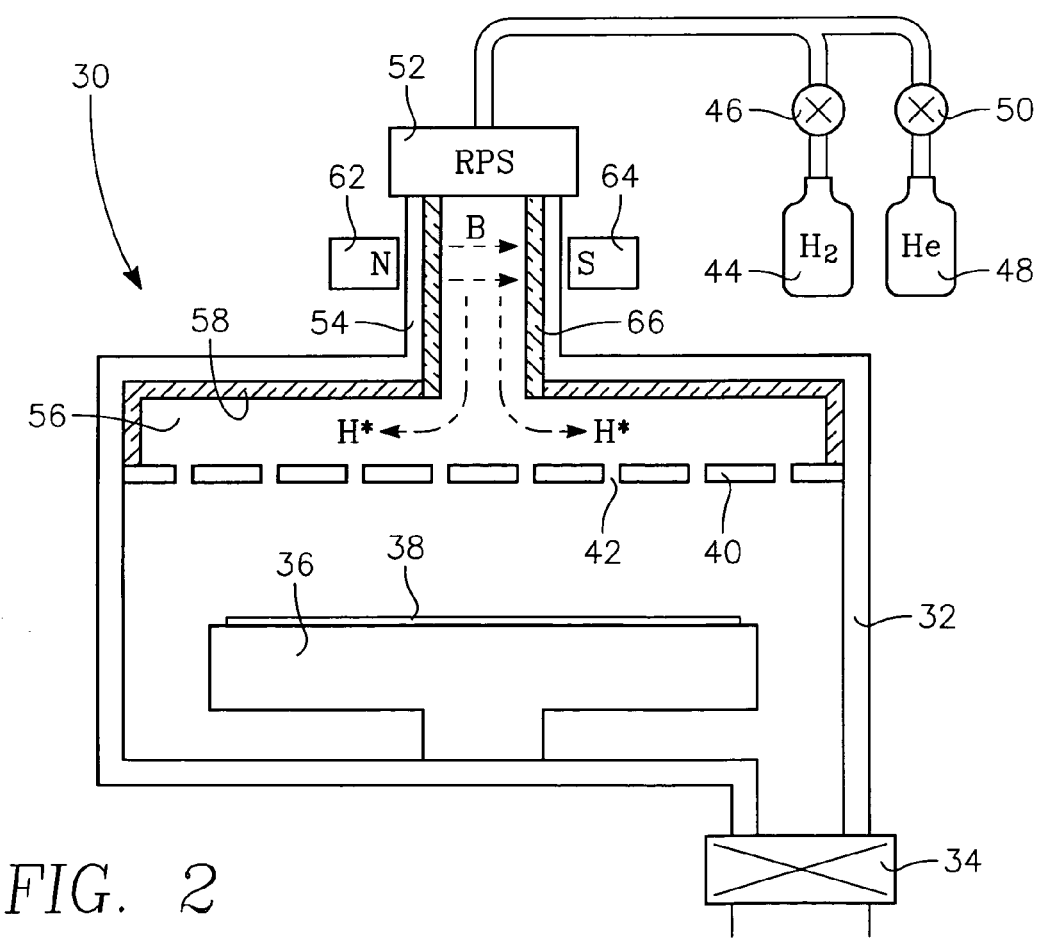
FIG. 2 is a cross-sectional view of a remote plasma clean (RPC) chamber usable with the invention.

However, radicals tend to be short lived since they have large cross sections and tend to recombine. Radical lifetimes can be significantly increased by placing, as illustrated in FIG. 2, a tubular dielectric liner 66 inside the supply tube 54 extending from the remote plasma source 52 to the manifold 56. The free standing dielectric liner 66 may be composed of, for example, quartz ($SiO_2$) or alumina ($Al_2O_3$). Advantageously, it may be removed from the bottom when the chamber lid is opened for maintenance without the need to dismantle the remote plasma source 52 or the ion filter or the remainder of the lid.

For the same reasons, the showerhead 40 and its manifold liner 58 may be composed of a dielectric, for example, alumina or more preferably quartz.

Figure 6:
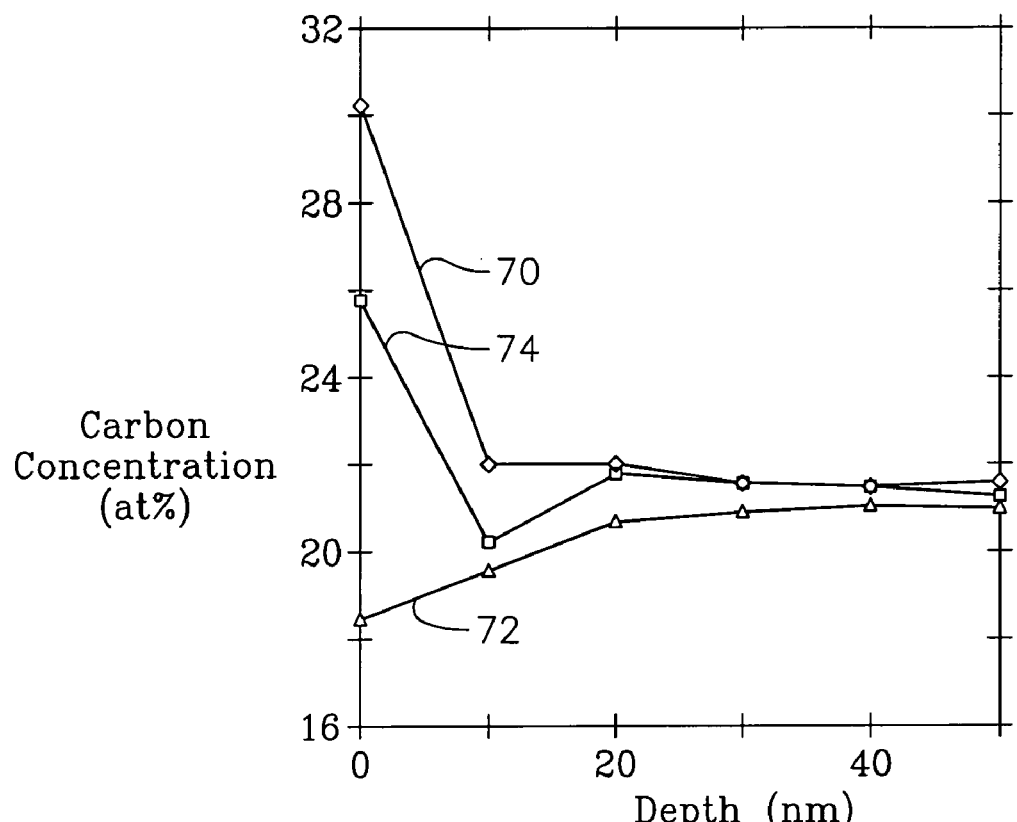
FIG. 6 is a graph of the carbon depletion as a function of depth with and without an ion filter.

X-ray photo spectroscopy (XPS) was used to measure the carbon content as a function of depth on a Black Diamond II (BDII) dielectric film of 200 nm thickness. In a first test, a BDII dielectric film was probed as deposited and before plasma cleaning. Plot 70 illustrated in the graph of FIG. 6 shows that the unprocessed film has a carbon content of about 20 at % over its bulk with a rise to about 30 at % at its surface. In a second test, a remote hydrogen plasma was used to clean a BDII film but without the magnetic filter. Plot 72 shows that the bulk shows virtually no depletion but that the carbon is significantly depleted at the surface. In a third test, the magnetic filter was activated. Plot 74 shows that the magnetic filter substantially reduces the surface depletion of carbon. The reduced carbon depletion helps to explain the reduced increase of dielectric constant in the carbon-based low-k dielectric when pre-cleaned according to one aspect of the invention.

Related tests involved probing BDII dielectric films with Fourier-transform infrared (FTIR) spectroscopy. The carbon content was monitored by the signal at a wavenumber of 1276 $cm^{-1}$ corresponding to the resonance of the Si—C bond. Without the magnetic filter, the spectrum shows a significant dip in the signal at 1276 $cm^{-1}$, indicating carbon depletion. With the magnetic filter, the dip is substantially reduced consistent with reduced carbon depletion.

Figure 7:
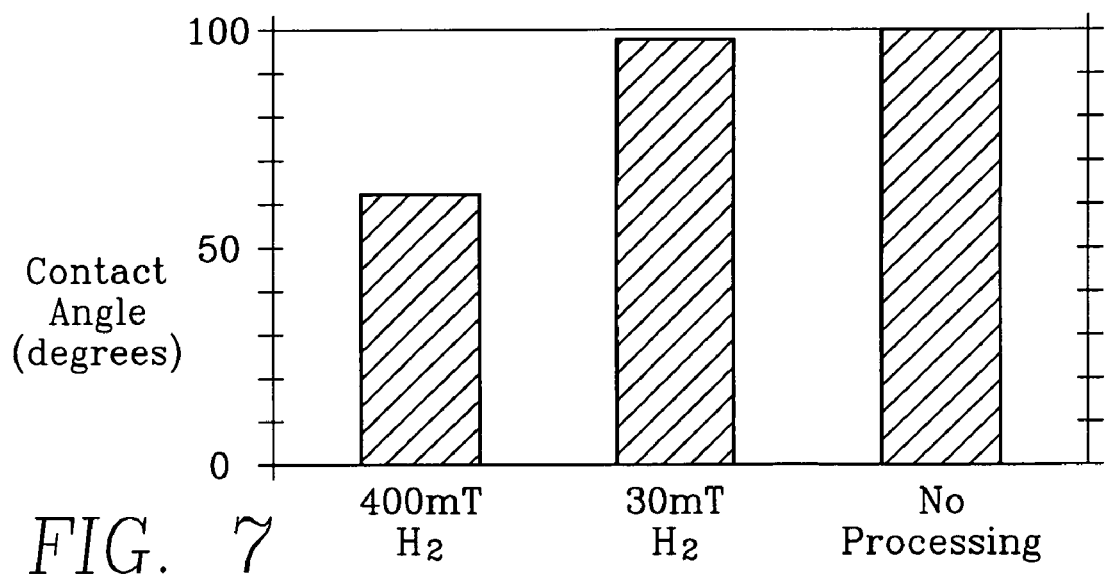
FIG. 7 is a bar chart of the dependence of water contact angle with the hydrogen pressure in a plasma pre-clean.

Another series of tests measured the water contact angle for BDIIx film without any processing after formation, after plasma cleaning with high-pressure hydrogen (400 milliTorr), and after plasma cleaning with low-pressure hydrogen (30 milliTorr). A low contact angle indicates that the material is more hydrophilic, that is, attracts water. Hydrophilic films are expected to exhibit poor resistance to moisture damage, believed to result from the high polarizability of water molecules. The results shown in the bar chart of FIG. 7 demonstrate there is a small decrease in the contact angle for plasma cleaning with low-pressure hydrogen, but a large decrease with high-pressure hydrogen. That is, the results suggest that moisture damage is reduced at low hydrogen pressure.

Figure 8:
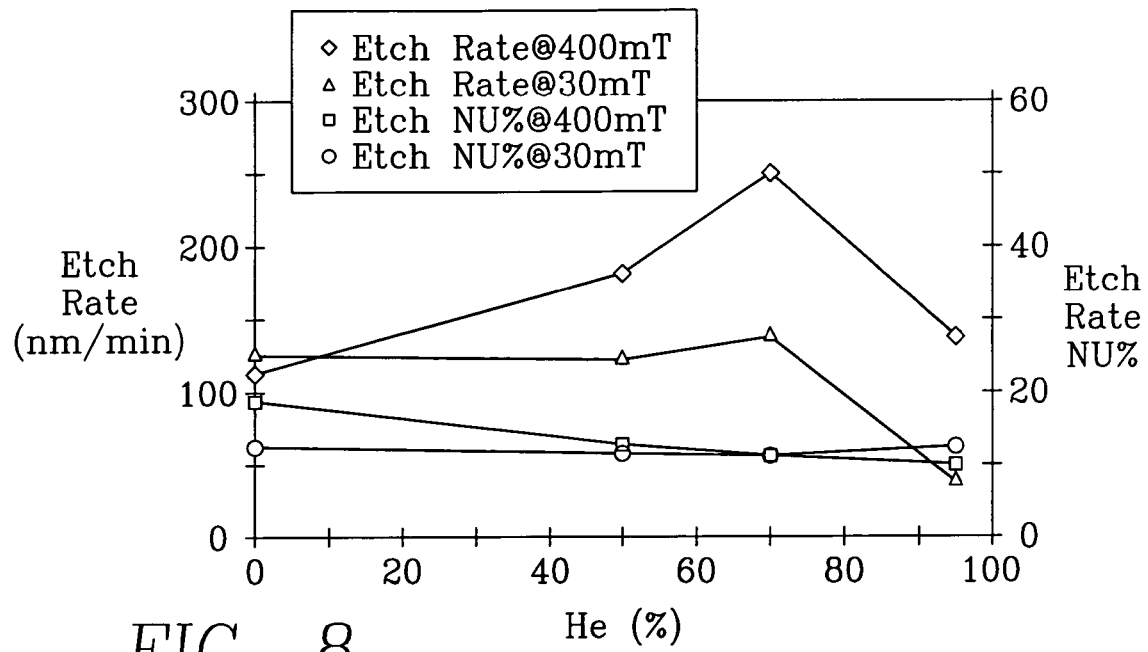
FIG. 8 is a graph illustrating the dependence of etch rate and its non-uniformity as a function of helium concentration according to two embodiments of the invention.

It appears that the partial pressure of hydrogen is one measure of the effectiveness of low-pressure hydrogen plasma pre-cleaning. Etch rate and its non-uniformity on BDIIx dielectric films were measured at both 30 and 400 milliTorr chamber pressure with pure hydrogen and with three mixtures of hydrogen and helium, specifically 50%, 70%, and 95% helium. The results shown in the graph of FIG. 8 demonstrate that the etch rate of 70% He, that is, a partial pressure of 120 milliTorr hydrogen, was substantially greater than with 95% He at 400 milliTorr and than with 0% He at 30 milliTorr and somewhat greater than with 50% He at 400 milliTorr. These results can be extrapolated to a desired range of 30 to 200 milliTorr partial pressure of hydrogen (or alternatively 50 to 92% helium) in a helium/hydrogen total pressure of 200 to 600 milliTorr. A narrower range is 80 to 150 milliTorr of hydrogen partial pressure in a helium/hydrogen partial pressure of 300 to 500 milliTorr. However, the invention is not necessarily limited to these ranges. It is speculated that either the additional helium absorbs on the chamber walls and prevents the radicals from being adsorbed there or the helium reduces the collisions between radicals and their recombination or helium metastable states interacting with the hydrogen. It is appreciated that the mixture of hydrogen and helium be supplied from a combined source, especially since pure hydrogen is considered especially hazardous.

Other noble gases such as neon or argon provide some of the benefits of helium, but helium is believed to be the most effective with plasma cleaning low-k dielectrics.

Figure 9:
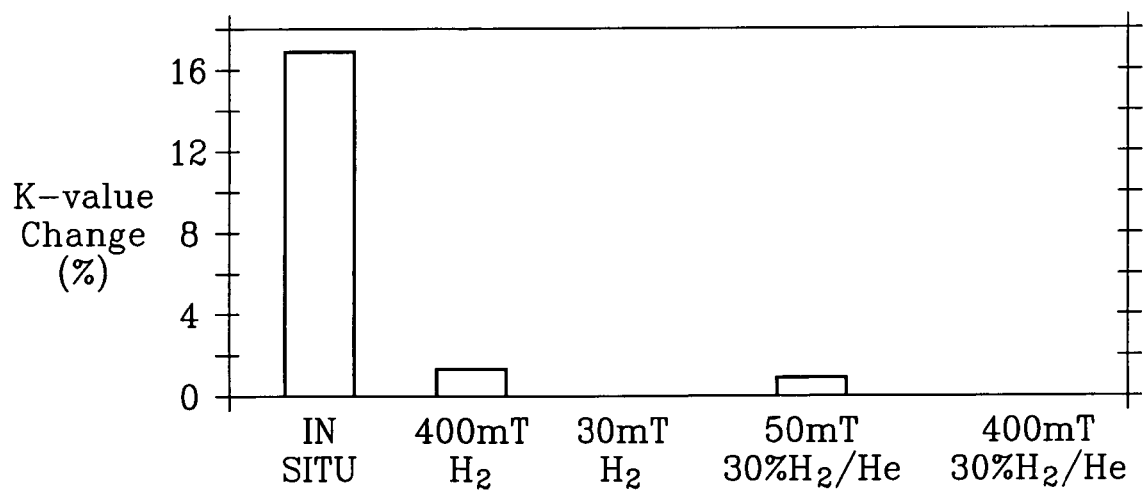
FIG. 9 is a bar chart of the increase of dielectric constant in plasma cleaning of a low-k dielectric constant in the prior art and according to several embodiments of the invention.

The dielectric constant change was measured for BDIIx films having a dielectric constant of 2.5 and pre-cleaned by various methods. The results are shown in the bar chart of FIG. 9. The in situ result is a comparative test using an in situ plasma of 95% He and 5% $H_2$ and shows a greater than 10% degradation. The results for 400 milliTorr of hydrogen plasma from a remote plasma source shows a degradation of greater than 1%. The results for 30 milliTorr of pure $H_2$ at 30 milliTorr and 400 milliTorr of 30% $H_2$ and 70% He from the remote plasma source show substantially no change in the dielectric constant. Thus, not only is a remotely generated hydrogen plasma better than an in situ plasma for pre-cleaning a low-k dielectric film, reduced hydrogen pressure or partial pressure substantially reduces if not eliminates an increase in its dielectric constant.

Although the invention has been described with reference to the pre-clean chamber of FIG. 2, the invention may be practiced in other types of chambers, for instance, not necessarily including a showerhead. Furthermore, the pre-clean chamber need not be a dedicated chamber but may be combined with other chambers, such as chambers used for etching such as inter-level dielectric etching, chemical vapor deposition, or sputtering so that multiple operations may be performed in the same chamber. Yet further, the invention is not necessarily limited to pre-cleaning photoresist residues on porous low-k dielectrics but may be used for other types of soft reducing etching.

The invention thus improves the plasma cleaning of fragile low-k dielectrics by increasing the etch rate and reducing dielectric degradation with little change in hardware.

The invention claimed is:

1. A method of plasma processing a substrate containing a dielectric layer, comprising the steps of:
   disposing the substrate in a vacuum chamber to which is attached a remote plasma source;
   passing a reducing processing gas through the remote plasma sources;
   magnetically filtering out ions in the processing gas delivered from the output from the remote plasma source and thence passing the processing gas into the chamber, the processing gas comprising hydrogen and substantially no oxygen or water; and
   during the filtering and passing step, maintaining a pressure within the chamber such that a hydrogen partial pressure in the chamber is less than 150 milliTorr and greater than 10 milliTorr.

2. The method of claim 1, wherein the hydrogen partial pressure is no more than 120 milliTorr and greater than 20 milliTorr.

3. The method of claim 1, wherein the processing gas consists essentially of hydrogen.

4. The method of claim 1, wherein the processing gas consists essentially of hydrogen and helium.

5. The method of claim 1, wherein the dielectric layer comprises at least 20 at % carbon and has a porosity of at least 10%.

6. The method of claim 1, wherein the dielectric layer has a dielectric constant of no more than 2.5.

7. The method of claim 1, wherein the substrate has a hole etched therein and prior to the passing step sidewalls of the hole are covered by no more than etch residues.

8. A method of plasma processing a substrate, comprising the steps of:
   disposing the substrate in a vacuum chamber to which is attached a remote plasma source;
   passing a reducing processing gas through the remote plasma source and thence into the vacuum chamber, the processing gas comprising hydrogen and a noble gas and substantially no oxygen or water; and
   during the passing step, maintaining in the vacuum chamber a total pressure of between 300 and 500 milliTorr and a partial pressure of hydrogen of between 80 and 150 milliTorr.

9. The method of claim 8, further comprising magnetically filtering the processing gas as it passes from the remote plasma source to the vacuum chamber to remove ions from the processing gas.

10. The method of claim 8, wherein the substrate contains a hole etched in a dielectric layer of the substrate and prior to the passing step the sidewalls of the hole are covered by no more than residues of the etching.

11. The method of claim 8, wherein the noble gas is helium.

12. The method of claim 11, wherein the processing gas consists essentially of hydrogen and helium.

13. A method of plasma processing a substrate containing a porous dielectric layer with a hole etched therein, sidewalls of the hole being covered by no more than residues resulting from the etching, comprising the steps of:
   disposing the substrate in a vacuum chamber to which is attached a remote plasma source;
   passing a reducing processing gas through the remote plasma source and thence into the vacuum chamber, the processing gas comprising hydrogen and substantially no oxygen or water; and
   during the passing step, maintaining a pressure within the chamber such that a hydrogen partial pressure in the chamber is less than 120 milliTorr and greater than 20 milliTorr.

14. The method of claim 13, wherein the dielectric layer comprises at least 20 at % carbon and has a porosity of at least 10%.

15. The method of claim 13, further comprising magnetically filtering the processing gas as it passes from the remote plasma source into the vacuum chamber.

\* \* \* \* \*